United States Patent
Colombo et al.

(10) Patent No.: US 8,309,438 B2
(45) Date of Patent: Nov. 13, 2012

(54) SYNTHESIZING GRAPHENE FROM METAL-CARBON SOLUTIONS USING ION IMPLANTATION

(75) Inventors: Luigi Colombo, Dallas, TX (US); Robert M. Wallace, Garland, TX (US); Rodney S. Ruoff, Austin, TX (US)

(73) Assignees: Board of Regents, The University of Texas System, Austin, TX (US); Texas Instruments, Inc., Dallas, TX (US)

( * ) Notice: Subject to any disclaimer, the term of this patent is extended or adjusted under 35 U.S.C. 154(b) by 376 days.

(21) Appl. No.: 12/706,116

(22) Filed: Feb. 16, 2010

(65) Prior Publication Data
US 2010/0224851 A1    Sep. 9, 2010

Related U.S. Application Data

(60) Provisional application No. 61/156,991, filed on Mar. 3, 2009.

(51) Int. Cl.
*H01L 21/20* (2006.01)
(52) U.S. Cl. .......... 438/478; 438/82; 438/105; 438/212; 438/739; 438/778; 257/4; 257/9; 257/24; 257/29; 257/76; 257/E21.211
(58) Field of Classification Search .................. None
See application file for complete search history.

(56) References Cited

U.S. PATENT DOCUMENTS

| | | | |
|---|---|---|---|
| 7,071,258 B1 | 7/2006 | Jang et al. | |
| 7,438,885 B1 | 10/2008 | Seal et al. | |
| 7,449,133 B2 | 11/2008 | Gruner et al. | |
| 7,618,300 B2 | 11/2009 | Liu et al. | |
| 2005/0127334 A1* | 6/2005 | Shibata et al. | 252/502 |
| 2009/0308520 A1* | 12/2009 | Shin et al. | 156/60 |

* cited by examiner

*Primary Examiner* — Kyoung Lee
(74) *Attorney, Agent, or Firm* — Robert A. Voigt, Jr.; Winstead P.C.

(57) ABSTRACT

A method and semiconductor device for synthesizing graphene using ion implantation of carbon. Carbon is implanted in a metal using ion implantation. After the carbon is distributed in the metal, the metal is annealed and cooled in order to precipitate the carbon from the metal to form a layer of graphene on the surface of the metal. The metal/graphene surface is then transferred to a dielectric layer in such a manner that the graphene layer is placed on top of the dielectric layer. The metal layer is then removed. Alternatively, recessed regions are patterned and etched in a dielectric layer located on a substrate. Metal is later formed in these recessed regions. Carbon is then implanted into the metal using ion implantation. The metal may then be annealed and cooled in order to precipitate the carbon from the metal to form a layer of graphene on the metal's surface.

11 Claims, 5 Drawing Sheets

SYNTHESIZING GRAPHENE FROM METAL-CARBON SOLUTIONS USING ION IMPLANTATION

CROSS-REFERENCE TO RELATED APPLICATIONS

This application is related to the following commonly owned U.S. patent application:

Provisional Application Ser. No. 61/156,991, "Synthesizing Graphene From Metal-Carbon Solutions Using Ion Implantation," filed Mar. 3, 2009, and claims the benefit of its earlier filing date under 35 U.S.C. §119(e).

TECHNICAL FIELD

The present invention relates to semiconductor device fabrication, and more particularly to synthesizing graphene from metal-carbon solutions using ion implantation.

BACKGROUND OF THE INVENTION

A material called graphene has recently been discovered to have properties believed to make it an excellent component of integrated circuits. Graphene is a one-atom-thick planar sheet of $sp^2$-bonded carbon atoms that are densely packed in a honeycomb crystal lattice. The carbon-carbon bond length in graphene is approximately 1.42 Å. Graphene is the basic structural element of all other graphitic materials including graphite, carbon nanotubes and fullerenes.

Currently, most graphene films are produced by exfoliation from natural graphite or are grown by thermal evaporation of silicon from single crystals of silicon carbide. Recently, attempts have been made to grow graphene on metal surfaces by introducing carbon to the metal using chemical vapor deposition, such as exposing the metal surface to methane. However, in the process of using chemical vapor deposition, hydrogen is present during the precursor stage which may lead to defects in the graphene. Further, it is difficult to grow patterned mono layers of graphite (i.e., graphene) using this process. That is, it is difficult to control the amount of carbon introduced in the metal using the process of chemical vapor deposition with precise dimensional control. In order to continue the progress towards developing smaller and more efficient semiconductor devices, growing graphene is highly desired.

Therefore, there is a need in the art to introduce controlled quantities of carbon in a metal thereby more effectively growing graphene. Further, there is a need in the art for a process in growing graphene without the presence of hydrogen to reduce the risk of defects in the graphene.

BRIEF SUMMARY OF THE INVENTION

In one embodiment of the present invention, a method for synthesizing graphene comprises implanting carbon in a metal substrate via ion implantation, where the carbon is distributed in the metal substrate. Further, the method comprises annealing the metal substrate with the implanted carbon. Additionally, the method comprises cooling the metal substrate with implanted carbon after annealing in order to precipitate the carbon from the metal to form a layer of graphene on a surface of the metal substrate. Additionally, the method comprises transferring the metal substrate with the layer of graphene onto a dielectric layer in such a manner whereby the layer of graphene is placed on the dielectric layer. Furthermore, the method comprises removing the metal substrate.

In another embodiment of the present invention, a semiconductor device comprises a silicon substrate, a dielectric layer on the silicon substrate and a graphene layer on the dielectric layer. The graphene layer is formed by implanting carbon into a metal by ion implantation, where the carbon is precipitated by diffusion from the metal to form the graphene layer on a surface of the metal via annealing and cooling the metal with the implanted carbon. The metal along with the layer of graphene is transferred onto the dielectric layer in such a manner whereby the layer of graphene is placed on the dielectric layer. The metal is removed after the transfer of the metal and the layer of graphene onto the dielectric layer.

In another embodiment of the present invention, a method for synthesizing graphene comprises patterning and etching a first set of regions of a dielectric layer located on a silicon substrate. The method further comprises depositing a metal barrier onto the dielectric layer. Additionally, the method comprises depositing a metal onto the metal barrier forming a stack of metal/metal barrier. In addition, the method comprises annealing the metal/metal barrier stack. Further, the method comprises performing a chemical mechanical polishing of the metal following the deposition of the metal onto the metal barrier whereby the metal resides in the first set of regions of the dielectric layer after the chemical mechanical polishing is performed. Furthermore, the method comprises patterning and etching photoresist mask regions to cover a second set of regions of the dielectric layer, where the second set of regions does not overlap with the first set of regions. In addition, the method comprises implanting carbon in the metal via ion implantation, where the carbon is distributed in the metal. Furthermore, the method comprises removing the photoresist mask regions. Further, the method comprises annealing the metal with the implanted carbon. Further, the method comprises cooling the metal with the implanted carbon after annealing in order to precipitate the carbon from the metal by diffusion to form a layer of graphene on a surface of the metal.

In another embodiment of the present invention, a semiconductor device comprises a silicon substrate and a dielectric layer on the silicon substrate. The dielectric layer comprises a set of etched regions whereby metal resides in the set of etched regions. A layer of graphene resides on a surface of the metal after the carbon is introduced in the metal via ion implantation and after the metal with the implanted carbon is annealed and cooled to precipitate the carbon from the metal by diffusion.

The foregoing has outlined rather generally the features and technical advantages of one or more embodiments of the present invention in order that the detailed description of the present invention that follows may be better understood. Additional features and advantages of the present invention will be described hereinafter which may form the subject of the claims of the present invention.

BRIEF DESCRIPTION OF THE SEVERAL VIEWS OF THE DRAWING

A better understanding of the present invention can be obtained when the following detailed description is considered in conjunction with the following drawings, in which.

DETAILED DESCRIPTION OF THE INVENTION

The present invention comprises a method and semiconductor device for synthesizing graphene using ion implantation of carbon. In one embodiment of the present invention, carbon is implanted in a metal using ion implantation. After the carbon is distributed in the metal, the metal is annealed and cooled in order to precipitate/segregate the carbon from the metal by diffusion to form a layer of graphene on the surface of the metal. The metal/graphene surface is then transferred to a dielectric layer located on a substrate (e.g., silicon with a dielectric) in such a manner that the graphene layer is placed on top of the dielectric layer. The metal layer is then removed, such as via wet etching. In another embodiment of the present invention, recessed regions are patterned and etched in a dielectric layer located on a substrate (e.g., silicon). After depositing the metal barrier onto the dielectric layer, metal is deposited onto the metal barrier. The semiconductor device is then planarized using chemical mechanical polishing thereby leaving metal only in the recessed regions. Photoresist mask regions are then formed to cover the exposed regions of the dielectric layer (i.e., cover all parts of the dielectric layer except the metal in the recessed regions). Carbon is then blanket implanted into the metal. The photoresist is then removed via a photoresist stripping technique. The metal with the implanted carbon may then be annealed and cooled in order to precipitate the carbon from the metal to form a layer of graphene on the surface of the metal.

As discussed in the Background section, currently, most graphene films are produced by exfoliation from natural graphite or are grown by thermal evaporation of silicon from single crystals of silicon carbide. Recently, attempts have been made to grow graphene on metal surfaces by introducing carbon to the metal using chemical vapor deposition, such as exposing the metal surface to methane. However, in the process of using chemical vapor deposition, hydrogen is present during the precursor stage which may lead to defects in the graphene. Further, it is difficult to grow patterned mono layers of graphite (i.e., graphene) using this process. That is, it is difficult to control the amount of carbon introduced in the metal using the process of chemical vapor deposition with precise dimensional control. In order to continue the progress towards developing smaller and more efficient semiconductor devices, growing graphene is highly desired. Therefore, there is a need in the art to introduce controlled quantities of carbon in a metal thereby more effectively growing graphene. Further, there is a need in the art for a process in growing graphene without the presence of hydrogen to reduce the risk of defects in the graphene.

Figure 1:
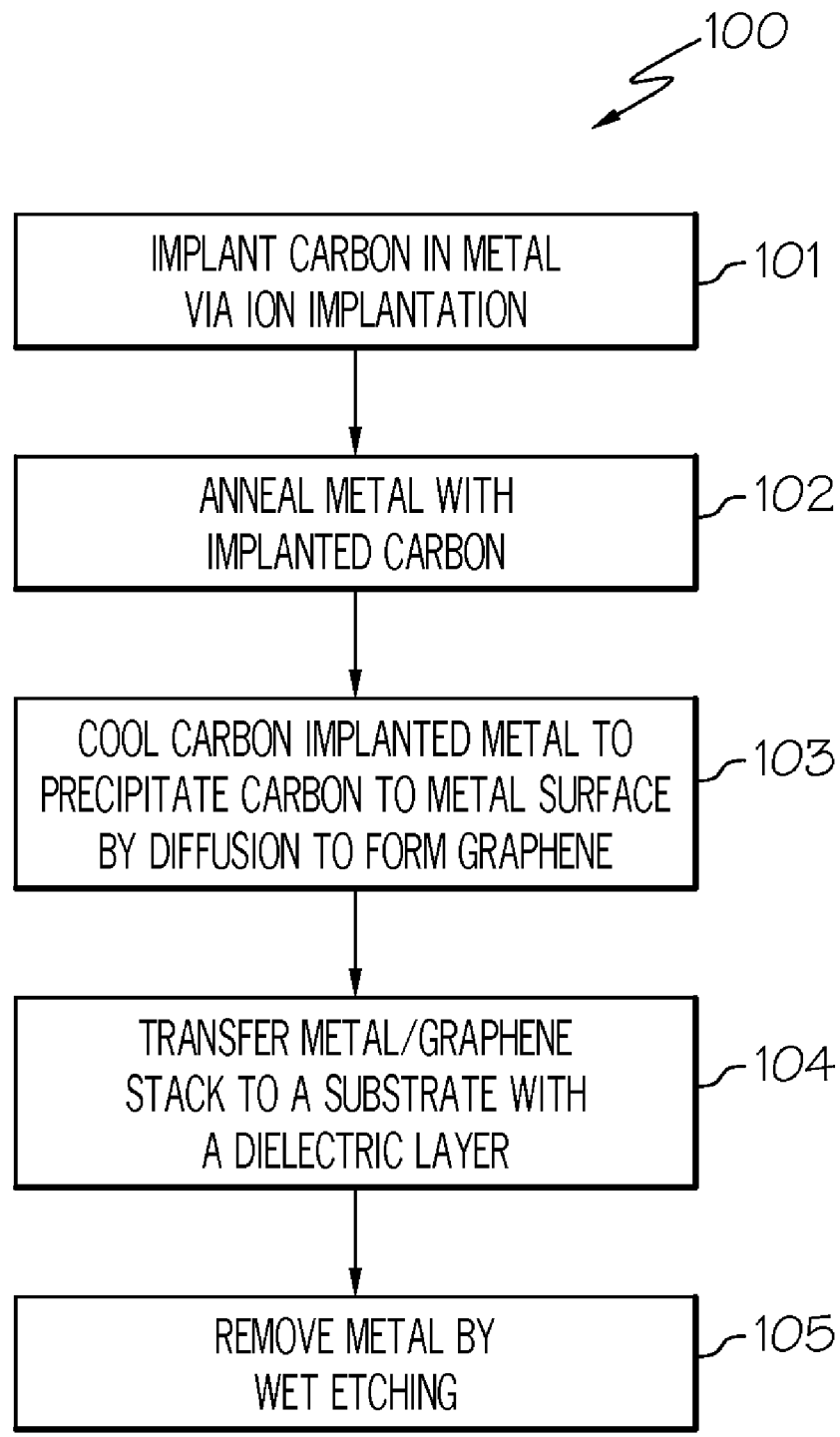
FIG. 1 is a flowchart of a method for synthesizing graphene using ion implantation of carbon in accordance with an embodiment of the present invention.

Controlled quantities of carbon may be introduced into the metal thereby more efficiently growing graphene as well as growing graphene without the presence of hydrogen using the principles of the present invention as discussed below in connection with FIGS. 1, 2A-D, 3 and 4A-F. FIG. 1 is a flowchart of a method for synthesizing graphene using ion implantation. FIGS. 2A-D depict cross-sectional views of the semiconductor device during the fabrication steps described in FIG. 1. FIG. 3 is a flowchart of an alternative method for synthesizing graphene using ion implantation. FIGS. 4A-F depict cross-sectional views of the semiconductor device during the fabrication steps described in FIG. 3.

Referring to FIG. 1, FIG. 1 is a flowchart of a method 100 for synthesizing graphene using ion implantation in accordance with an embodiment of the present invention. FIG. 1 will be discussed in conjunction with FIGS. 2A-D, which depict cross-sectional views of semiconductor device 200 during the fabrication steps described in FIG. 1 in accordance with an embodiment of the present invention.

Figure 2A:
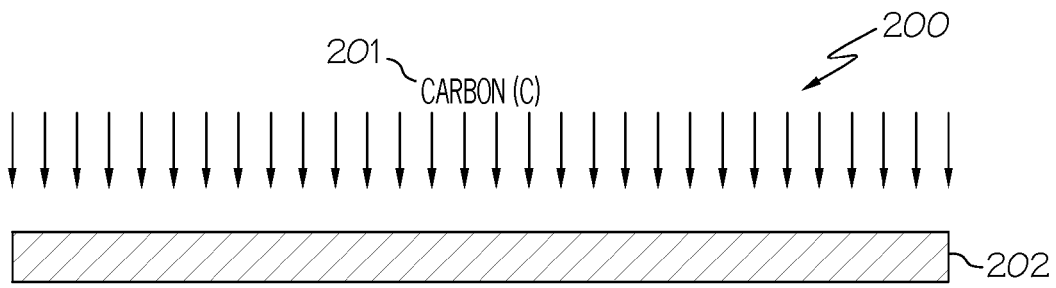
FIGS. 2A-D depict cross-sectional views of a semiconductor device during the fabrication of the steps described in FIG. 1 in accordance with an embodiment of the present invention.

Referring to FIG. 1, in conjunction with FIGS. 2A-D, in step 101, carbon 201 is implanted into a metal substrate 202 (e.g., copper, nickel, cobalt, iron, zinc, solid solution of the aforementioned metals, ruthenium, platinum, etc.) using ion implantation as illustrated in FIG. 2A. In one embodiment, during the implantation of carbon 201 into metal substrate 202, dopants (e.g., boron) (not shown in FIG. 2A) may be introduced into metal substrate 202. Carbon 201 is distributed (not shown in FIG. 2A) in metal substrate 202 based upon one or more parameters of ion implantation, such as energy, flux and angle.

In step 102, metal substrate 202, with the implanted carbon 201, is annealed. In one embodiment, metal substrate 202 is annealed using isothermal annealing. In another embodiment, metal substrate 202 is annealed using rapid thermal annealing.

Figure 2B:
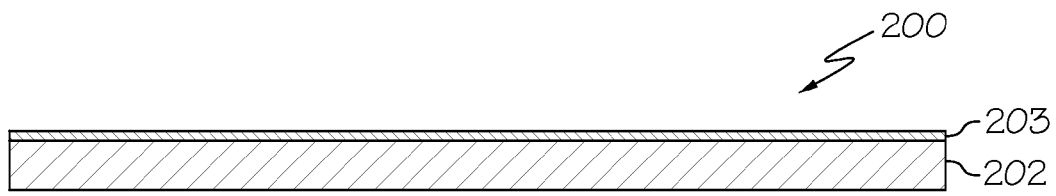
Figure 3:
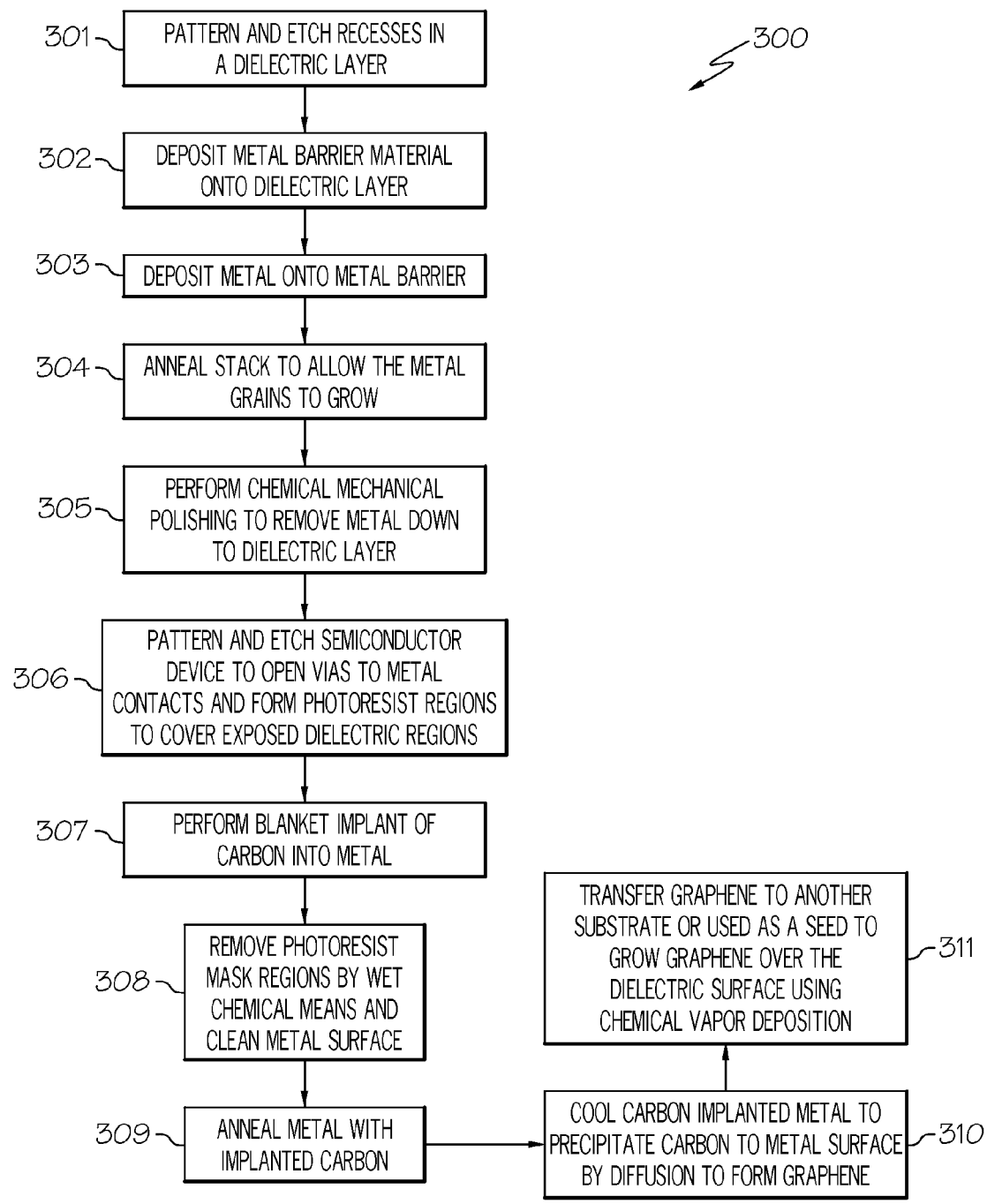
FIG. 3 is an alternative method for synthesizing graphene using ion implantation of carbon in accordance with an embodiment of the present invention.

In step 103, metal substrate 202, with the implanted carbon 201, is cooled after annealing in order to precipitate/segregate carbon 201 from metal 202 by diffusion to form a layer of graphene 203 on the surface of metal substrate 202 as illustrated in FIG. 2B. As used herein, "precipitate" refers to separating or segregating carbon 201 from metal 202.

Figure 2C:
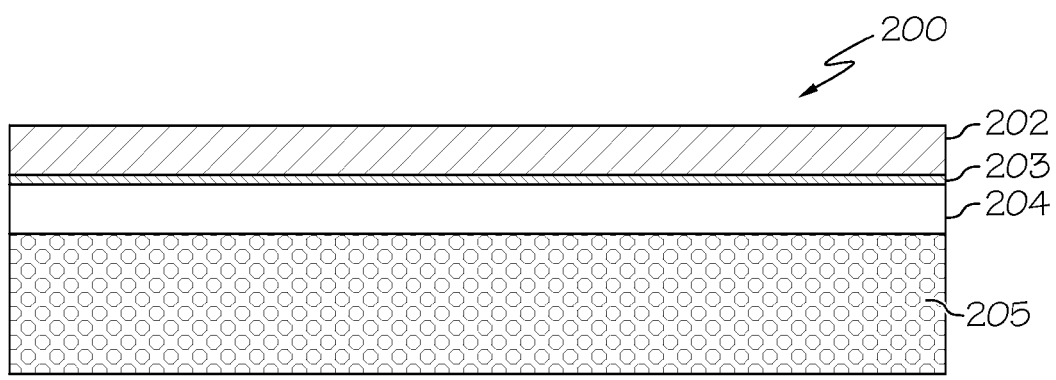

In step 104, metal substrate 202, along with the layer of graphene 203, are transferred onto a dielectric layer 204 in such a manner whereby the layer of graphene 203 is placed on the surface of dielectric layer 204 as illustrated in FIG. 2C. In one embodiment, dielectric layer 204 may reside on a silicon substrate 205 as illustrated in FIG. 2C. Further, in one embodiment, dielectric layer 204 is a layer of silicon dioxide. Dielectric layer 204 may further include high-k dielectrics, such as SiON, $ZrO_2$, ZrSiO, ZrLaO, ZrAlO, ZrSiON, ZrLaON, ZrAlON, LaLuO, LaLuON, and hafnium based dielectrics, such as but not limited to $HfO_2$, HfSiO, HfLaO, HfAlO, HfSiON, HfLaON, HfAlON, HfZrO, HfZrON and hafnium zirconate ($Hf_xZr_{1-x}O_2$).

Figure 2D:
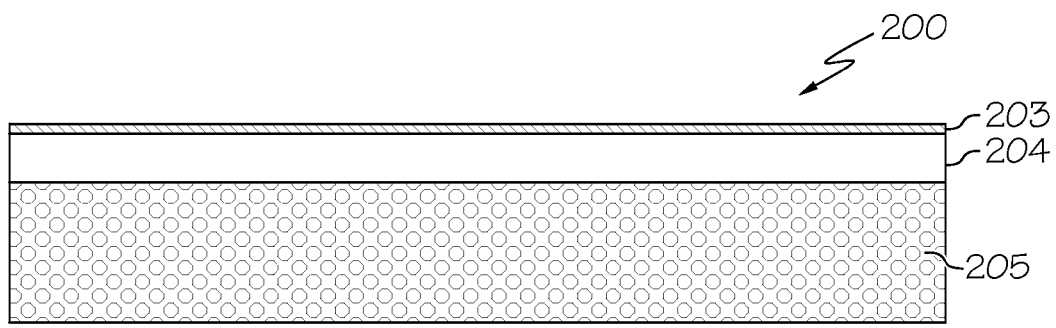

In step 105, metal substrate 202 is removed as illustrated in FIG. 2D. In one embodiment, metal substrate 202 is removed using wet etching.

Method 100 may include other and/or additional steps that, for clarity, are not depicted. Further, method 100 may be executed in a different order presented and the order presented in the discussion of FIG. 1 is illustrative. Additionally, certain steps in method 100 may be executed in a substantially simultaneous manner or may be omitted.

In another embodiment, a layer of polymethyl methacrylate ("PMMA") or polydimethlysiloxane ("PDMS") is deposited onto the graphene/metal stack. The metal is removed by chemical etching and then the PMMA/graphene layer or PDMS/graphene layer is transferred onto a substrate, such as silicon dioxide/silicon. After the transfer, the PMMA or PDMS can be chemically removed to expose the graphene.

An alternative embodiment for synthesizing graphene using ion implantation is discussed below in connection with FIGS. 3 and 4A-F. FIG. 3 is a flowchart of an alternative method 300 for synthesizing graphene using ion implantation in accordance with an embodiment of the present invention.

FIG. 3 will be discussed in conjunction with FIGS. 4A-F, which depict cross-sectional views of semiconductor device 400 during the fabrication steps described in FIG. 3 in accordance with an embodiment of the present invention.

Figure 4A:
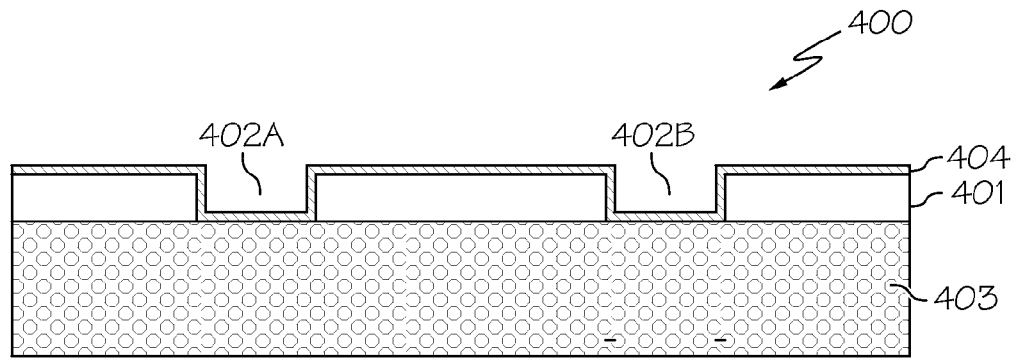
FIGS. 4A-F depict cross-sectional views of a semiconductor device during the fabrication of the steps described in FIG. 3 in accordance with an embodiment of the present invention.

Referring to FIG. 3, in conjunction with FIGS. 4A-F, in step 301, a dielectric layer 401 is patterned and etched to form recesses 402A-B extending to the barrier of a silicon substrate 403 as illustrated in FIG. 4A. Recesses 402A-B may collectively or individually be referred to as recesses 402 or recess 402, respectively. While FIG. 4A depicts two recesses 402 being formed, any number of recesses 402 may be formed from dielectric layer 401. In one embodiment, dielectric layer 401 is a layer of silicon dioxide.

In step 302, a metal barrier 404, such as tantalum, tantalum nitride, titanium, titanium nitride, ruthenium or any other appropriate barrier for the selected carbon host metal, is deposited onto dielectric layer 401, including over recesses 402 in dielectric layer 401, as illustrated in FIG. 4A.

Figure 4B:
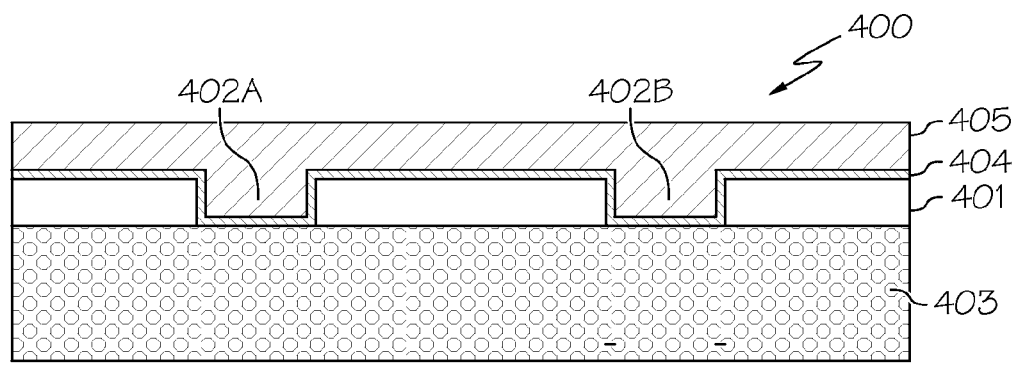

In step 303, a metal 405 (e.g., copper, nickel, cobalt, iron, zinc, solid solution of the aforementioned metals, ruthenium, platinum, etc.) is deposited onto metal barrier 404 as illustrated in FIG. 4B.

In step 304, the metal stack (metal 405/metal barrier 404) is annealed to increase the grain size of the carbon host metal.

Figure 4C:
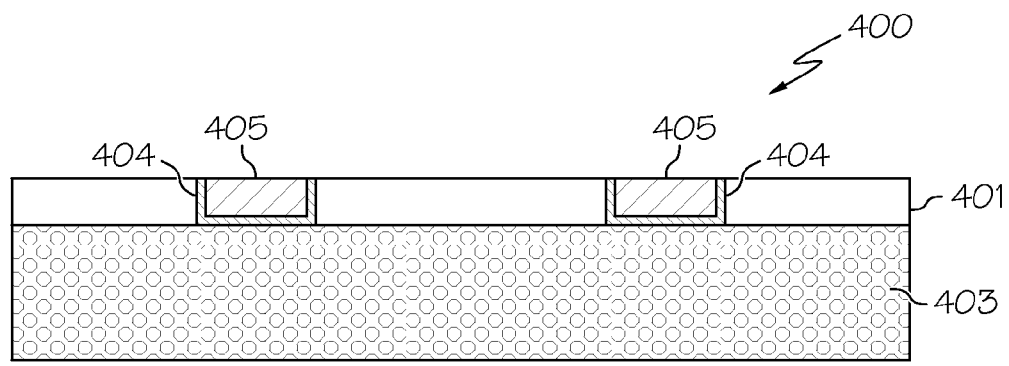

In step 305, a chemical mechanical polishing of semiconductor device 400 is performed following the deposition of metal 405 onto metal barrier 404 in order to planarize the surface as illustrated in FIG. 4C.

Figure 4D:
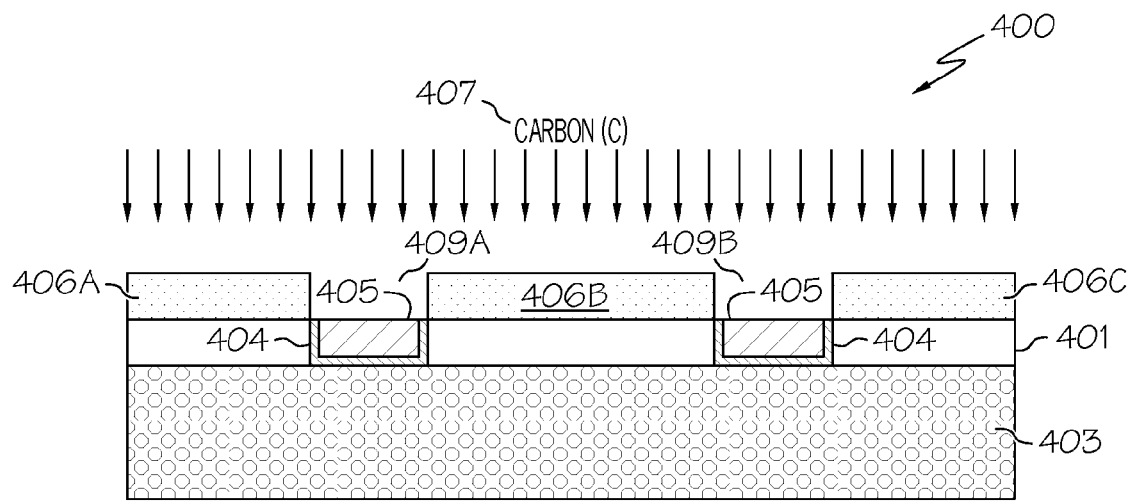

In step 306, semiconductor device 400 is patterned and etched to form photoresist mask regions 406A-C to cover exposed regions of dielectric layer 401 as well as open vias 409A-B to metal contacts 405 as illustrated in FIG. 4D. Vias 409A-B may collectively or individually be referred to as vias 409 or via 409, respectively. Further, photoresist mask regions 406A-C may collectively or individually be referred to as photoresist mask regions 406 or photoresist mask region 406, respectively. It is noted that any number of vias 409 or photoresist mask regions 406 may be formed and that FIGS. 4A-F are illustrative.

In step 307, carbon 407 is implanted (blanket implant) into metal 405 via ion implantation as illustrated in FIG. 4D. In one embodiment, during the implantation of carbon 407 into metal 405, dopants (e.g., boron) (not shown in FIG. 4D) may be introduced into metal 405. In one embodiment, carbon 407 is implanted into the non-masked areas using vertical ion implantation. In one embodiment, carbon 407 is distributed in metal 405 based upon one or more parameters of ion implantation, such as energy, flux and angle as illustrated in FIG. 4E.

Figure 4E:
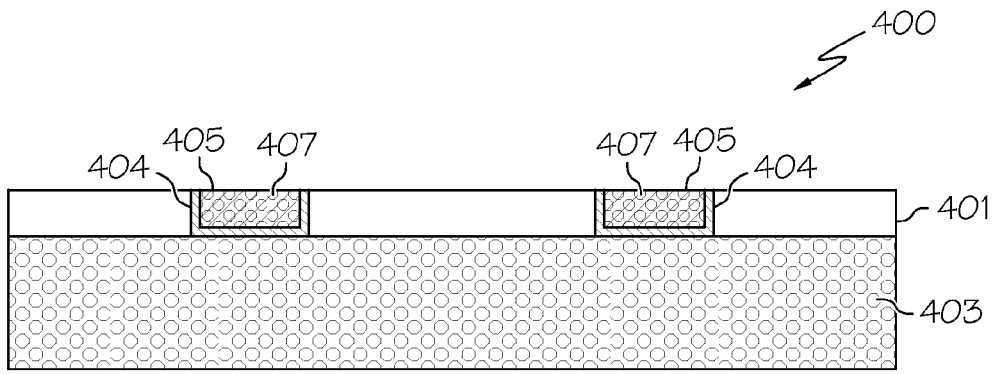

In step 308, photoresist mask regions 406 are removed by wet chemical means and the surface of metal 405 is cleaned as illustrated in FIG. 4E. In one embodiment, photoresist mask regions 406 are removed via a photoresist stripping technique, including organic stripping, inorganic stripping and dry stripping.

In step 309, metal 405, with the distributed carbon 407, is annealed. In one embodiment, metal 405 is annealed using isothermal annealing. In another embodiment, metal 405 is annealed using rapid thermal annealing.

Figure 4F:
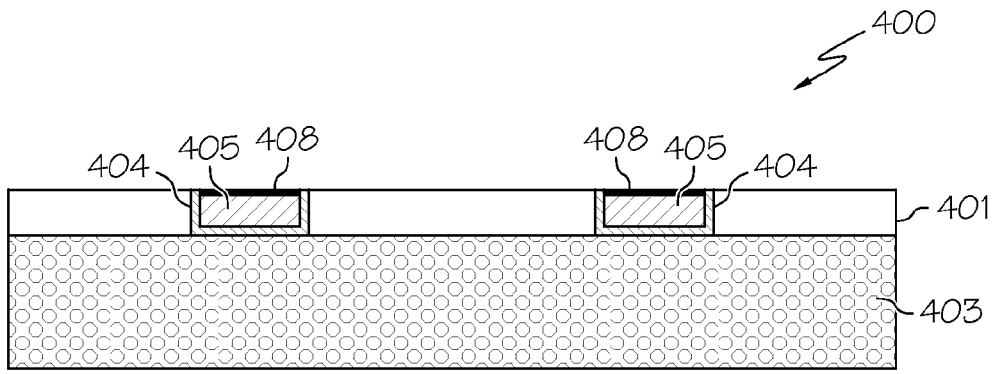

In step 310, metal 405, with the distributed carbon 407, is cooled after annealing in order to precipitate/segregate carbon 407 from metal 405 by diffusion to form a layer of graphene 408 on the surface of metal 405 as illustrated in FIG. 4F.

In step 311, graphene 408 is transferred to another substrate (not shown) or used as a seed to grow graphene 408 over the surface of dielectric layer 401 using chemical vapor deposition.

Method 300 may include other and/or additional steps that, for clarity, are not depicted. Further, method 300 may be executed in a different order presented and the order presented in the discussion of FIG. 3 is illustrative. Additionally, certain steps in method 300 may be executed in a substantially simultaneous manner or may be omitted.

Although the method and semiconductor device are described in connection with several embodiments, it is not intended to be limited to the specific forms set forth herein, but on the contrary, it is intended to cover such alternatives, modifications and equivalents, as can be reasonably included within the spirit and scope of the invention as defined by the appended claims.

The invention claimed is:

1. A method for synthesizing graphene, the method comprising:
    implanting carbon in a metal substrate via ion implantation, wherein said carbon is distributed in said metal substrate;
    annealing said metal substrate with said implanted carbon;
    cooling said metal substrate with said implanted carbon after said annealing in order to precipitate said carbon from said metal to form a layer of graphene on a surface of said metal substrate;
    transferring said metal substrate with said layer of graphene onto a dielectric layer in such a manner whereby said layer of graphene is placed on said dielectric layer; and
    removing said metal substrate.

2. The method as recited in claim 1 further comprising:
    introducing dopants into said metal substrate during said implantation of said carbon in said metal substrate.

3. The method as recited in claim 1, wherein said carbon is distributed in said metal substrate based upon one or more of the following parameters of said ion implantation: energy, flux and angle.

4. The method as recited in claim 1, wherein said metal substrate is annealed using isothermal annealing.

5. The method as recited in claim 1, wherein said metal substrate is annealed using rapid thermal annealing.

6. The method as recited in claim 1, wherein said dielectric layer comprises one of the following: silicon dioxide, SiON, ZrO2, ZrSiO, ZrLaO, ZrAlO, ZrSiON, ZrLaON, ZrAlON, LaLuO, LaLuON, and hafnium based dielectric, wherein said dielectric layer is located on a silicon substrate.

7. The method as recited in claim 1, wherein said metal substrate is removed via wet etching.

8. The method as recited in claim 1, wherein said metal substrate comprises one of the following: copper, nickel, cobalt, iron, zinc, a solid solution of aforementioned metals, ruthenium and platinum.

9. A semiconductor device, comprising:
    a metal substrate comprising carbon implanted into said metal substrate via ion implantation, wherein said metal substrate implanted with said carbon is annealed;
    a layer of graphene formed on a surface of said metal substrate, wherein said layer of graphene is formed by cooling said annealed metal substrate to precipitate said carbon from said metal substrate by diffusion;
    a dielectric layer, wherein said layer of graphene resides on a surface of said dielectric layer, wherein said metal substrate and said layer of graphene are transferred onto said dielectric layer, wherein said metal substrate is removed after a transfer of said metal substrate and said layer of graphene onto said dielectric layer; and
    a silicon substrate, wherein said dielectric layer resides on said silicon substrate.

10. The semiconductor device as recited in claim 9, wherein said metal substrate comprises one of the following: copper, nickel, cobalt, iron, zinc, solid solution of aforementioned metals, ruthenium and platinum.

11. A semiconductor device, comprising:
  a silicon substrate;
  a dielectric layer on said silicon substrate; and
  a graphene layer on said dielectric layer, wherein said graphene layer is formed by implanting carbon into a metal via ion implantation, wherein said carbon is precipitated by diffusion from said metal to form said graphene layer on a surface of said metal via annealing and cooling said metal with said implanted carbon, wherein said metal along with said layer of graphene is transferred onto said dielectric layer in such a manner whereby said layer of graphene is placed on said dielectric layer, wherein said metal is removed after said transfer of said metal and said layer of graphene onto said dielectric layer;
  wherein said dielectric layer comprises one of the following: silicon dioxide, SiON, ZrO2, ZrSiO, ZrLaO, ZrAlO, ZrSiON, ZrLaON, ZrAlON, LaLuO, LaLuON, and hafnium based dielectric.

* * * * *